United States Patent [19]

Seabaugh

[11] Patent Number: 5,554,860
[45] Date of Patent: Sep. 10, 1996

[54] RESONANT TUNNELING TRANSISTOR NOISE GENERATOR

[75] Inventor: Alan C. Seabaugh, Richardson, Tex.

[73] Assignee: Texas Instruments Incorporated, Dallas, Tex.

[21] Appl. No.: 425,664

[22] Filed: Apr. 17, 1995

Related U.S. Application Data

[63] Continuation of Ser. No. 156,152, Nov. 22, 1993, abandoned.

[51] Int. Cl.⁶ .................... H01L 29/06; H01L 31/0328; H01L 29/00
[52] U.S. Cl. .................... 257/25; 257/197; 257/198; 257/563; 257/618
[58] Field of Search .................... 257/25, 183, 197, 257/198, 563, 618, 564, 560, 414, 428

[56] References Cited

U.S. PATENT DOCUMENTS 4,939,562  7/1990  Adlerstein .................... 257/198
5,260,609  11/1993  Takatsu .................... 307/454

FOREIGN PATENT DOCUMENTS 63-9966    1/1988   Japan .................... 257/25
63-250855  10/1988  Japan .................... 257/197
5152318    6/1993   Japan .................... 257/197

Primary Examiner—Mahshid Saadat
Attorney, Agent, or Firm—Christopher L. Maginniss; W. James Brady, III; Richard L. Donaldson

[57] ABSTRACT

This is a method of generating noise comprising the step of switching a plurality of resonant tunneling diodes each located in the emitter or base of a multi finger transistor such that each of the resonant tunneling diodes switches at a different input voltage. Other devices and methods are also disclosed.

13 Claims, 8 Drawing Sheets

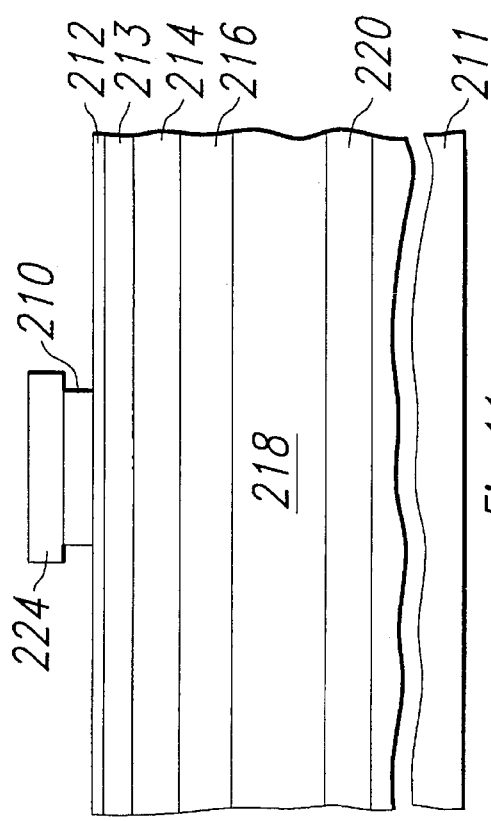
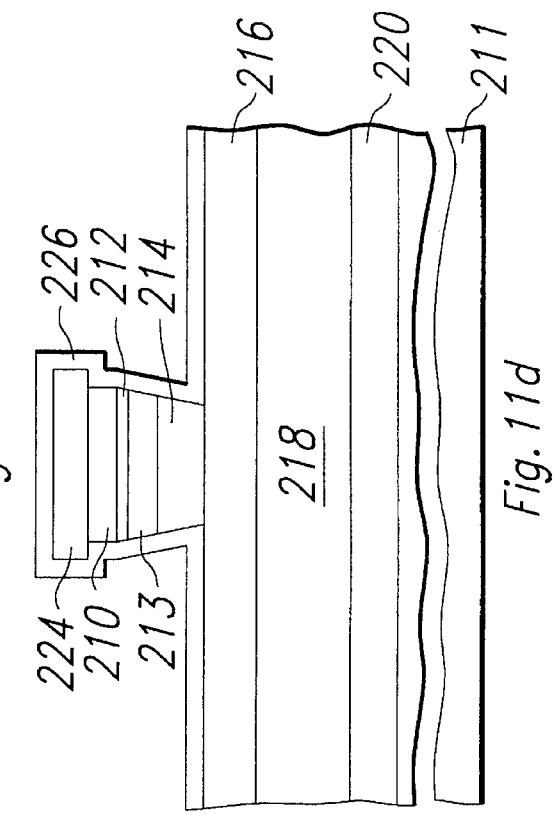
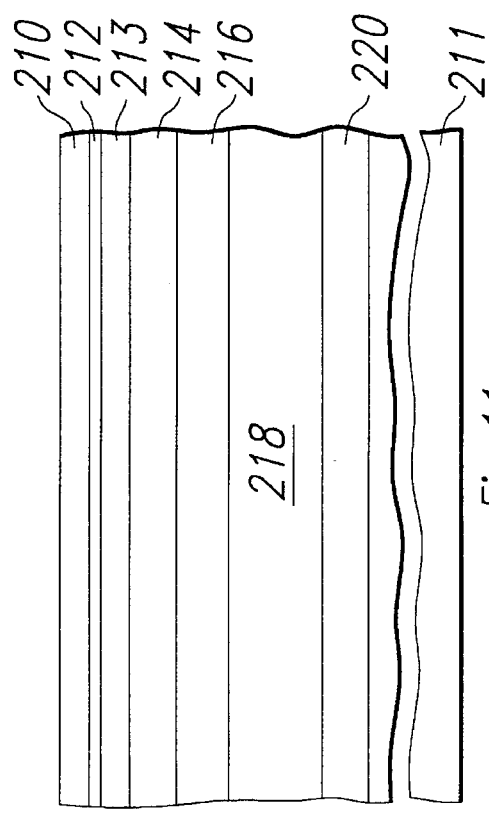
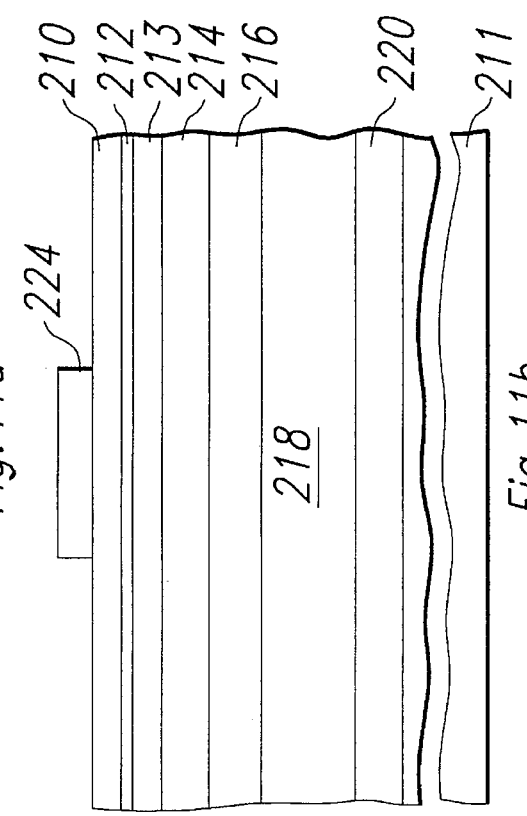

5,554,860

1

RESONANT TUNNELING TRANSISTOR NOISE GENERATOR

CROSS-REFERENCE TO RELATED APPLICATIONS

This application is a continuation of application Ser. No. 08/156,152, filed Nov. 22, 1993, now abandoned.

The following co-assigned patent applications are related: Ser. No. 07/954,206, filing date Sep. 30, 1992 TI Case No. TI-16457.

FIELD OF THE INVENTION

This invention generally relates to electronic devices and more particularly to resonant tunneling devices and systems.

BACKGROUND OF THE INVENTION

Without limiting the scope of the invention, its background is described in connection with resonant tunneling devices.

A resonant tunneling diode (RTD) in its simplest embodiment consists of a sequence of five semiconductor layers. The outer two layers are the contact layers into which electrons enter and exit the semiconductor layer sequence. The interior three dissimilar semiconductor layers differ in their energy band gaps in the sequence wide/narrow/wide band gap with layer thicknesses comparable to the electron Bloch wavelength (typically less than 10 nm). This sequence of layers produces an energy profile through which electrons must travel and which consists of two energy barriers separated by a narrow region referred to as a quantum well.

Classically, an electron with energy, called the Fermi energy, approaching the first energy barrier with an energy below the barrier energy is reflected, analogous to a baseball rebounding off a concrete wall or to an electromagnetic wave at the end of an open-circuited transmission line. Quantum mechanics, however, allows that as the physical dimensions of the barrier decrease toward the wavelength of the particle, there is an increasing probability that the particle will be transmitted instead of reflected. Thus under certain conditions an electron can pass through the barrier even with energy below the barrier potential. This classically-forbidden phenomenon is called tunneling.

If the quantum well width is selected to be approximately equal to some integer or half-integer multiple of the electron wavelength, a standing wave can be built up by constructive interference analogous to the standing waves in a microwave cavity. Electrons at these wavelengths couple into and out of the quantum well more readily than others.

The electron energy, E, and its wavelength, I, are inversely related by the equation, $E=h^2/2\,ml^2$, where h is Planck's constant and m is the effective electron mass. Since the electron's energy can be controlled by adjusting the bias across the structure, the transmission (or current flow) through the double-barrier depends sensitively on the applied voltage. One can think of the double-barrier structure as an energy bandpass filter which transmits for certain applied biases and reflects the electron for other applied biases. The electron is said to be in resonance when the incoming electron energy matches the resonant transmission energy of the quantum-well structure.

In the RTD, the current increases monotonically with applied voltage until the average incoming electron energy is approximately equal to the resonance energy and the electron tunnels efficiently through the double-barrier structure. At slightly higher energy (applied bias) the electron no longer couples into the well efficiently and the transmission (current) is reduced. At still higher applied voltages, the electron's energy is sufficient for it to get over the barriers giving rise to an increasing current with bias. Thus the current-voltage characteristic of the resonant tunneling diode is N-shaped. It is this characteristic which is utilized to advantage in resonant tunneling electron devices.

SUMMARY OF THE INVENTION

Generally, and in one form of the invention a method of generating noise is presented comprising the step of switching a plurality of resonant tunneling diodes, each located in an emitter finger of a multi-emitter transistor such that each of the resonant tunneling diodes switches at a different input voltage. This may be accomplished for example, where the area of two or more of the emitter fingers is unequal or where a resistor is placed in series with one or more of the resonant tunneling diodes.

In another form of the invention a resonant tunneling transistor is presented comprising: a collector; a plurality of emitter fingers, with at least one resonant tunneling diode in each of the emitter fingers; and a base. Preferably, the area of the emitter fingers varies such that each of the resonant tunneling diode switches at a different input voltage or a resistor is placed in series with one or more of said resonant tunneling diodes.

In yet another form of the invention a method of generating noise is presented comprising the step of switching a plurality of resonant tunneling diodes, each located in a base finger of a multi-base transistor such that each of the resonant tunneling diodes switches at a different input voltage. This may be accomplished for example, where the area of two or more of the base fingers is unequal or where a resistor is placed in series with one or more of the resonant tunneling diodes.

In still another form of the invention a resonant tunneling transistor is presented comprising: a collector; an emitter; and a plurality of base fingers with at least one resonant tunneling diode in each of the base fingers. Preferably, the area of the base fingers varies such that each of the resonant tunneling diode switches at a different input voltage or a resistor is placed in series with one or more of said resonant tunneling diodes.

BRIEF DESCRIPTION OF THE DRAWINGS

In the drawings:

FIGS. 11a–11g are sequential processing steps in an embodiment of a method for achieving the present invention;

Corresponding numerals and symbols in the different figures refer to corresponding parts unless otherwise indicated.

DETAILED DESCRIPTION OF PREFERRED EMBODIMENTS

For some applications, it is important to generate noise over a particular frequency band to frustrate the transmission or reception of another user. In the present state-of-the-art, this can be accomplished by the use of a p-i-n diode biased in its avalanche region and amplified by a high frequency transistor.

The present application utilizes a resonant tunneling transistor with multiple emitter fingers which incorporates a resonant tunneling diode (RTD) in each of the emitters. By altering the emitter areas, a switching noise component to an input signal can be created. Because the switching of the resonant tunneling emitters is uncorrelated and because each of the RTD emitters will tend to self oscillate due to their negative resistance, a high power noise spectrum can be generated.

Figure 1:
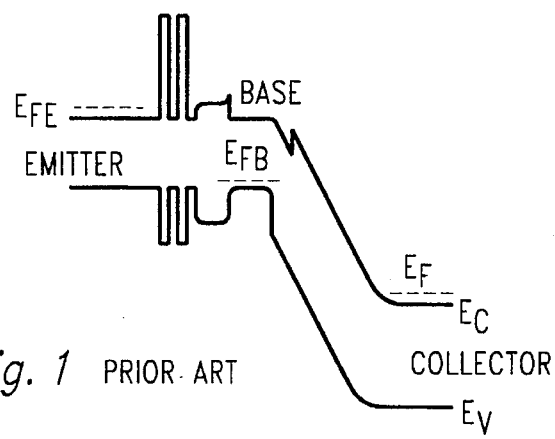
FIG. 1 is an energy band diagram of a resonant tunneling bipolar transistor common emittertransistor characteristics.
Figure 2:
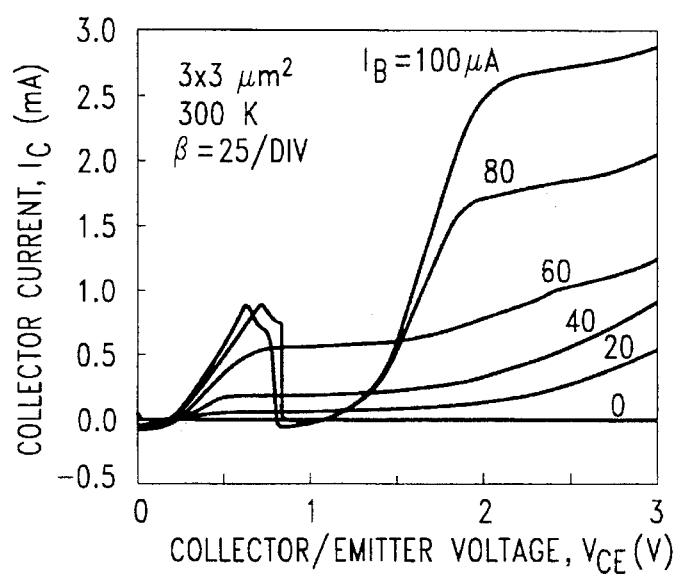
FIG. 2 shows collector current dependence on base current.
Figure 3:
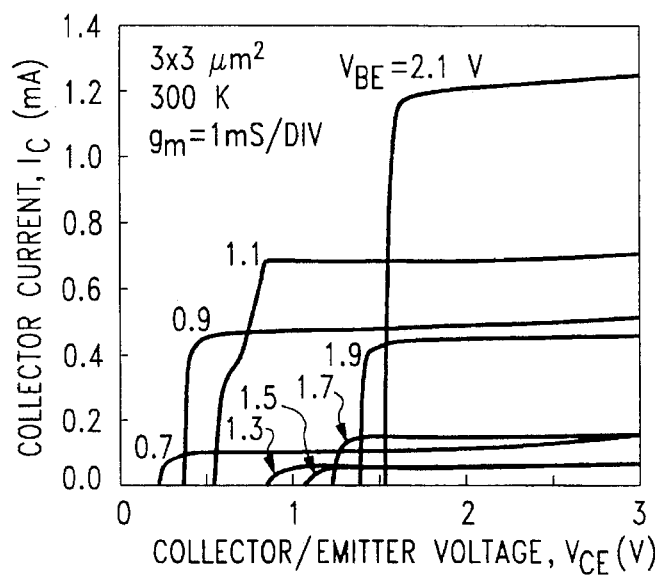
FIG. 3 shows collector current dependence on base/emitter voltage bias.

Resonant tunneling transistors have been demonstrated in a variety of geometries. In particular, heterojunction bipolar transistors (HBTs) and hot electron transistors (HETs) with one or more double-barrier quantum well energy filters located in the emitter yield resonant tunneling bipolar transistors (RTBTs) and resonant tunneling hot electron transistors (RHETs) respectively. FIG. 1 shows the energy band diagram for an NPN RTBT biased into the active region; in this particular device the emitter has an increase in bandgap between the double barrier and the base to facilitate independent connection of the double barrier quantum well and HBT device sections. The resonant tunneling of the emitter leads to a negative differential resistance (NDR) region in the transistor characteristics with current gain as shown in the curves of FIGS. 2 and 3 which show collector current dependence upon base current and base/emitter voltage bias, respectively. Seabaugh, et al. "Co-Integration of Resonant Tunneling and Double Heterojunction Bipolar Transistors on InP," IEEE Electron Device Letters 472 (1993) describes the characteristics of the RTBT.

Figure 4A:
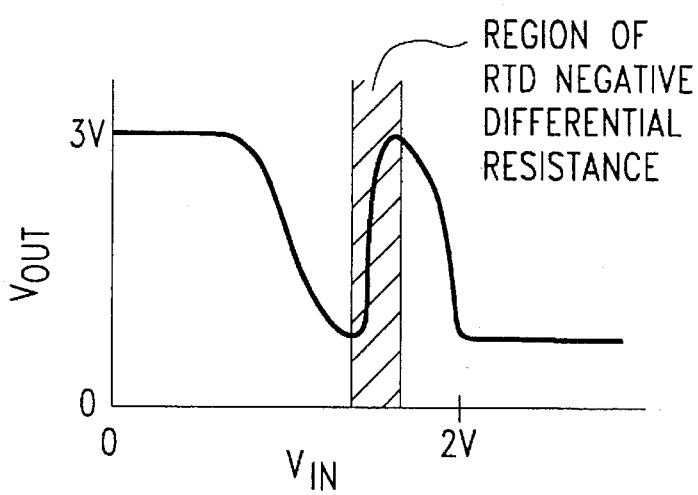
FIG. 4a and 4b are a dc transfer characteristic and a circuit schematic, respectively, of a resonant tunneling transistor with a single emitter finger.
Figure 4B:
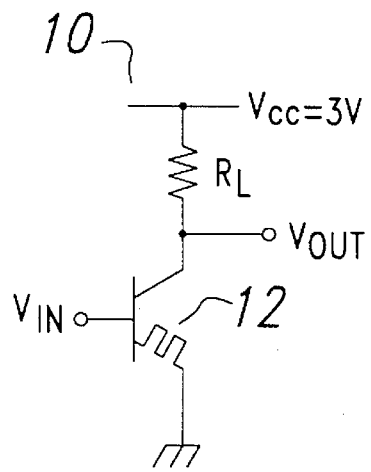
Figure 5:
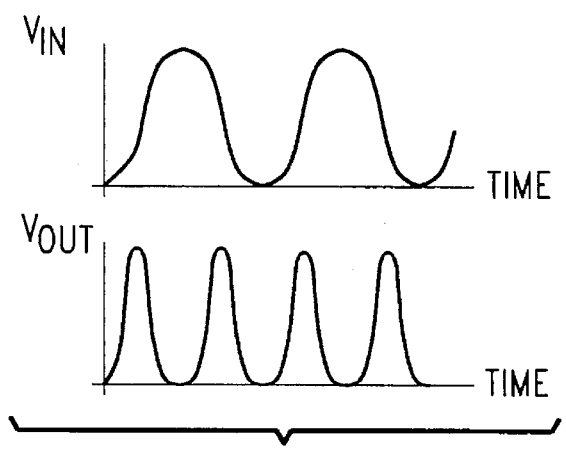
FIG. 5 is an ac transfer characteristic of a resonant tunneling transistor with a single emitter finger.

The common emitter transfer characteristic for a resonant tunneling transistor is shown in FIG. 4a. A schematic diagram of a resonant tunneling transistor is shown in FIG. 4b. For low input bias the RTD 12 in the emitter of the transistor 10 is in a low conductance state. As the input bias increases the RTD 12 in the emitter reaches its resonant, high conductance state and then switches off through a region of NDR. Further increase in input voltage beyond the NDR region allows the base to again supply current to the transistor and the transistor turns on again. A frequency multiplier can be obtained by the application of an ac input voltage to the RTBT as taught by F. Capasso, et al., "Quantum effect devices" in *High Speed Semiconductor Devices* ed. by S. M. Sze (John Wiley & Sons, N.Y. 1990) pp. 465–515. The input signal is doubled in frequency due to the action of the RTD in the transistor emitter. (See FIG. 5). Additional integer multiplications can be obtained by the incorporation of multiple resonances conditions in the emitter heterostructure.

Figure 6A:
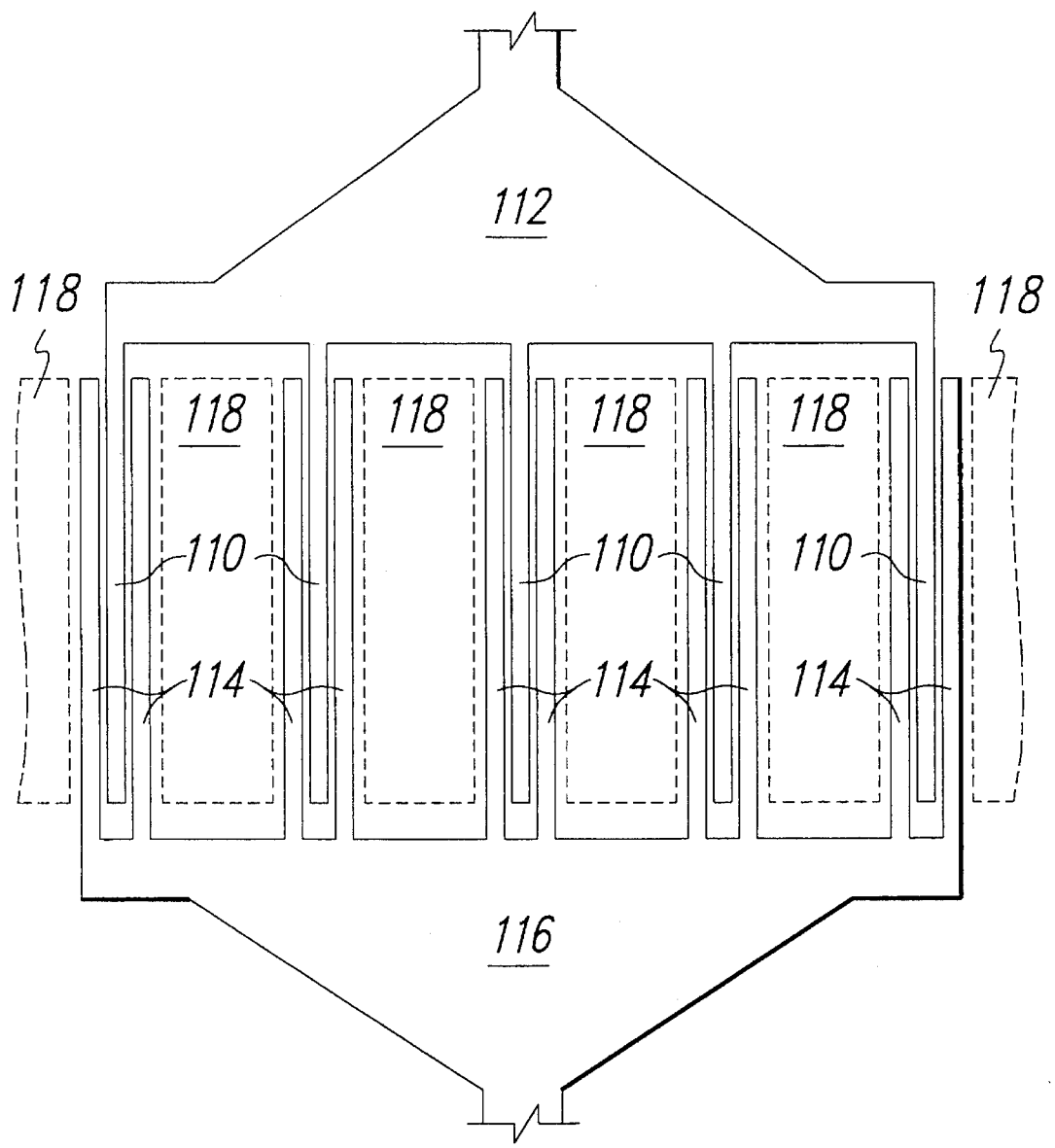
FIGS. 6a and 6b are a top view and a cross-sectional view, respectively, of a multi finger heterojunction transistor.
Figure 6B:
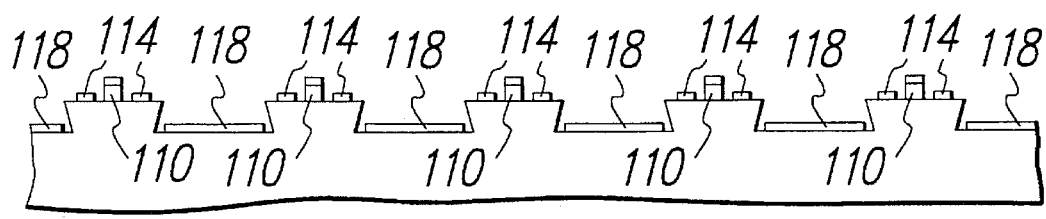

High power amplifiers often employ multi-finger structures to increase the total power output as taught by Khatibzadeh, et al. "12W Monolithic X-band HBT Power Amplifier," 1992 Monolithic Microwave and Millimeter Wave IC Symposium. In bipolar devices such as Si bipolar transistors or heterojunction bipolar transistors, these fingers are generally in the emitter structure. A bipolar transistor's emitter fingers typically are laid out as shown in the prior art structure of FIG. 6a and 6b, with each finger designed to deliver a certain amount of current. In FIG. 6a the emitter fingers 110 are connected to a common emitter feed structure 112: which leads to circuitry that comprises the device of which the transistor is a part. Similarly, base fingers 114 run along either side of each emitter finger 110 and connect to a common base feed structure 116. Collector contacts 118, shown as dotted lines are typically connected to one another by airbridges (not shown) that span the base and emitter fingers. The mesa cross-sections of the emitter and base regions are shown in FIG. 6b. The entire device can be considered to consist of many sub-devices connected together.

Figure 7A:
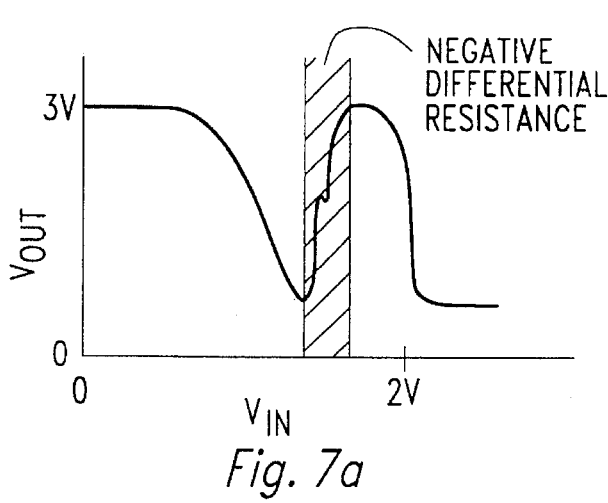
FIG. 7a and 7b are a transfer characteristic and a circuit schematic, respectively, of a resonant tunneling transistor with two emitter fingers of nominally equal areas.
Figure 7B:
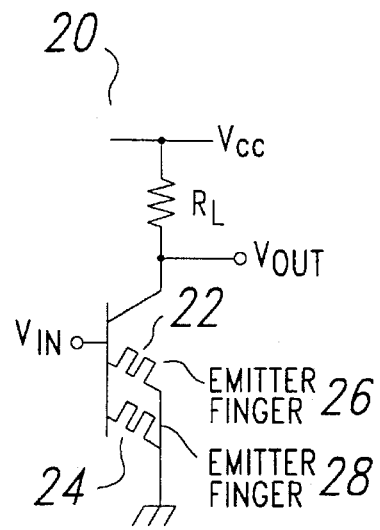
Figure 8A:
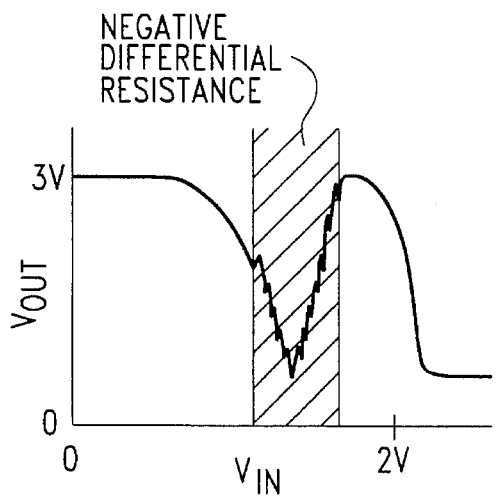
FIGS. 8a and 8b are a transfer characteristic and a circuit schematic, respectively, of a resonant tunneling transistor with twelve emitter fingers with differing emitter areas.
Figure 8B:
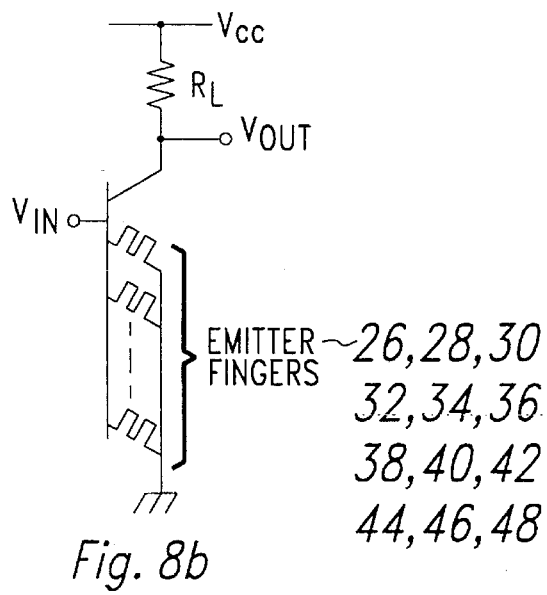

The negative differential resistance characteristic of a resonant tunneling transistor can be increased by the incorporation of multiple emitter fingers to the transistor structure. FIG. 7b shows the schematic diagram of a two finger resonant tunneling transistor. differences in the emitter RTD finger areas causes the resonant peak current to be changed. The input voltage which causes the RTD to switch depends on both the peak current and the value of the series loading resistance, therefore each of the RTD emitter fingers 26, 28 in FIG. 7b will switch at a different input voltage in a way determined by the absolute magnitude; of the finger area. Shown in FIG. 7a is the transfer characteristic of a two finger RTBT 20 in which the two RTDs 22,24 switch at a different input voltage. The effect of these switching voltage differences is to increase the effective width of the NDR region and to introduce a switching noise spike into the transfer characteristic. Increasing the number of emitter fingers 26, 28, 30, 32, 34, 36, 38, 40, 42, 44, 46, 48 increases the number of noise spikes and the width of the NDR region. (See FIGS. 8a & 8b). Twelve fingers are shown in this example, however, more or less could be used.

Figure 9A:
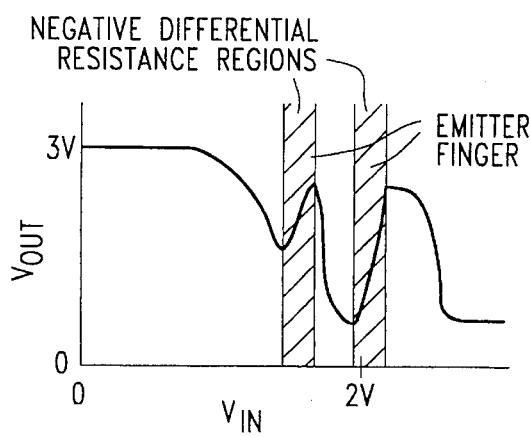
FIGS. 9a and 9b are a transfer characteristic and a circuit schematic, respectively, of a resonant tunneling transistor with two emitter fingers of nominally equal areas and including an emitter resistor in series with one of the emitters.
Figure 9B:
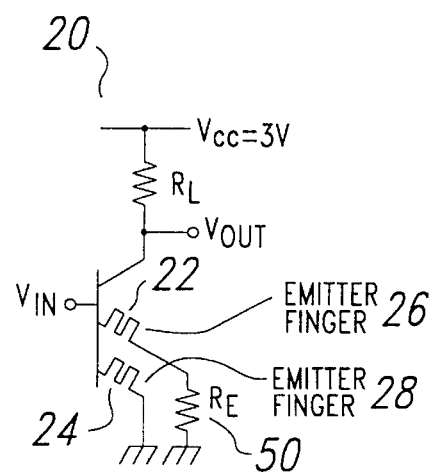

As an alternative method to alter the resonant switching voltage, in order to widen the NDR region and introduce switching noise, an emitter resistance 50 can be added in series with one of the RTD emitter fingers 22,24, using, for example, a series epitaxial resistor layer or by thin film processing. The voltage drop across the series resistance can be used to shift the input bias voltage required for resonance thereby causing the RTD emitters to switch separately. (See FIGS. 9a & 9b).

Figure 10A:
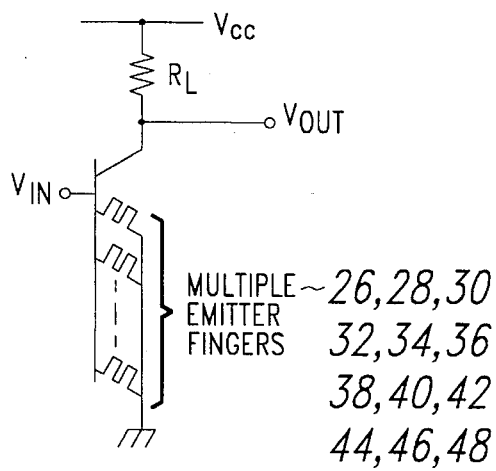
FIGS. 10a and 10b are a circuit schematic and an ac transfer characteristic, respectively, of a resonant tunneling transistor with switching noise induced by multiple emitter fingers.
Figure 10B:
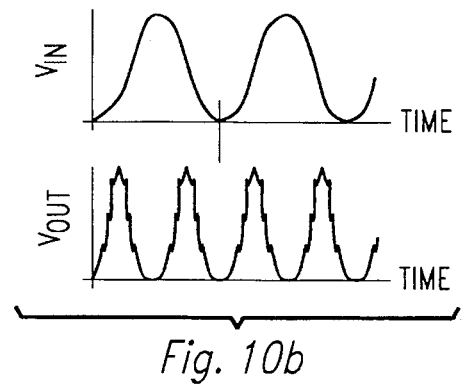

Referring to FIGS. 10a & 10b, as a noise generator the multiple NDR regions produce a switching noise component which rides on the frequency multiplied input signal characteristic. The RTD switching is uncorrelated because it depends upon the absolute value of the emitter finger areas. In addition to tile switching noise, high frequency oscillations associated with the negative resistance regions of each of the emitters act to generate an additional noise power spectrum whose oscillation band is determined by the dynamic impedance of the external circuit.

Figure 11E:
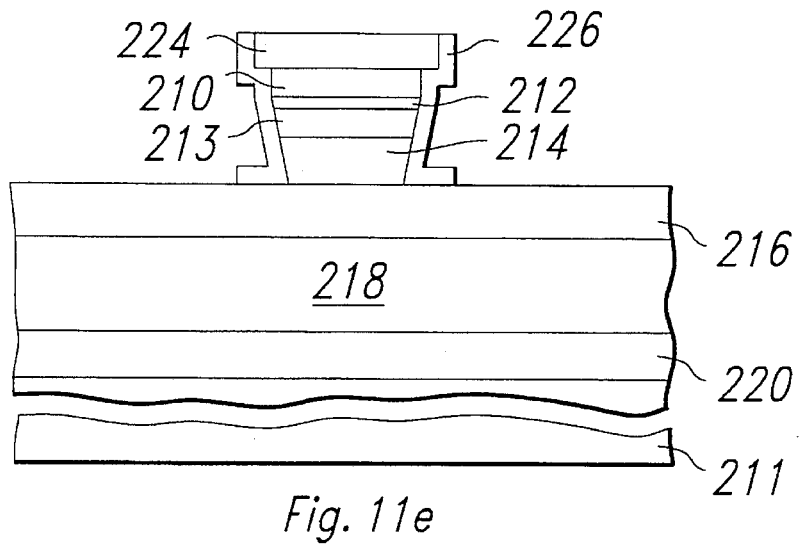

With reference to FIGS. 11a–11g, an example method for fabricating an embodiment of the present invention is described hereinbelow. This method is only intended as an example and is not the only way the present invention could be practiced. A substrate material for this process is shown in FIG. 11a; note that the vertical is exaggerated in the drawings for clarity. It is composed of a semi-insulating semiconductor material 211 (such as GaAs). A subcollector layer 220 of n-type GaAs, for example, is epitaxially grown on the substrate 211 by a suitable process (such as Molecular Beam Epitaxy (MBE) or Metal Organic Chemical Vapor Deposition (MOCVD)) to a thickness of approximately 1 μm and doped with preferably Si to a concentration of approximately $5 \times 10^{18}$ cm$^{-3}$. A collector layer 218 is epitaxially grown on subcollector layer 220 to a thickness of approximately 1 μm, doped at approximately $1 \times 10^{16}$ cm$^{-3}$ and is preferably made of GaAs. A base epilayer 216 of GaAs, for example, is deposited onto collector layer 218 to a thickness of approximately 0.08 μm and doped with C, for example, to a concentration of approximately $\geq 3 \times 10^{19}$ cm$^{-3}$. Resonant tunneling double barrier 214 preferably consisting of two AlAs tunnel barriers with an approximately 2 nm thickness cladding an approximately 4 nm GaAs quantum well, is then deposited onto base layer 216. GaAs buffer layer 213 of preferably n-type GaAs doped to a concentration of approximately $5 \times 10^{18}$ cm$^{-3}$ of thickness of approximately 100 Angstroms may be grown on the resonant tunneling double barrier 214. A preferably InGaAs top emitter contact layer 212 doped to a concentration of approximately $>1 \times 10^{19}$ cm$^{-3}$ may then be grown on buffer layer 213. A layer 210 of WiS, for example, may then be sputter deposited on emitter contact layer 212 to be used to form an ohmic contact.

Figure 11F:
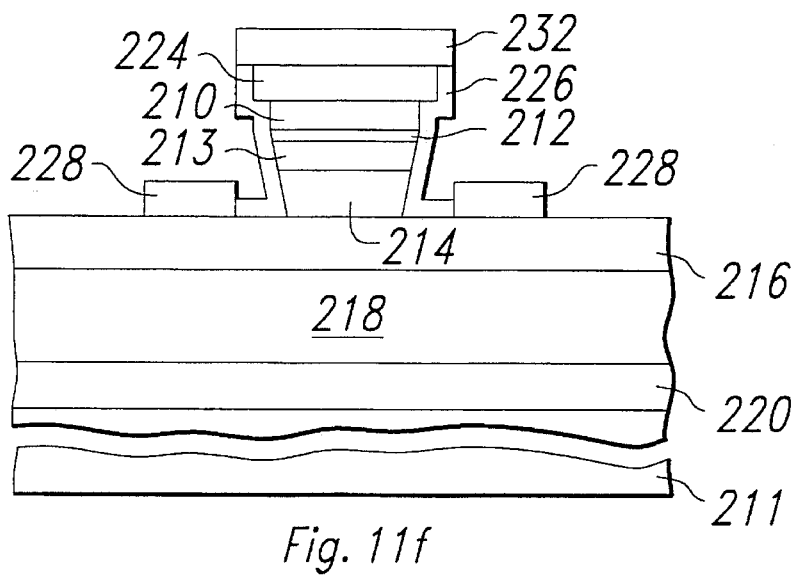
Figure 11G:
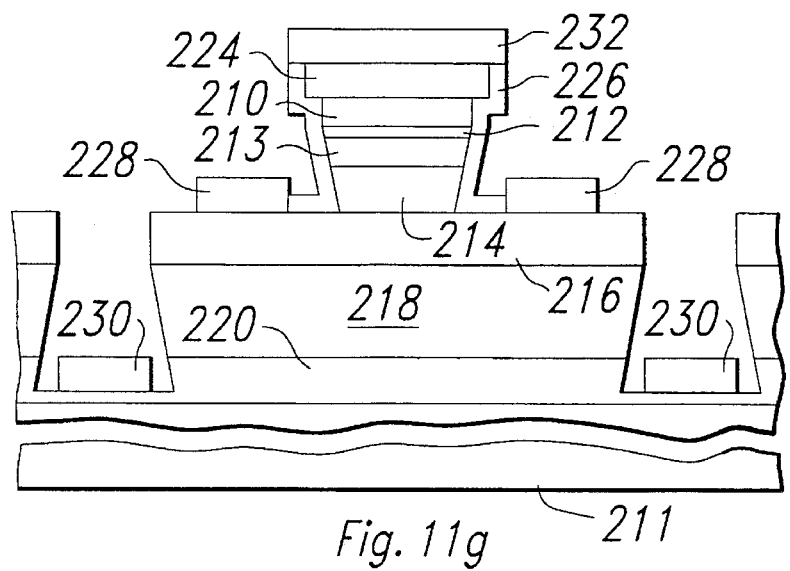

A photoresist layer (not shown) is spun on, for example, and the transistor emitter is defined. An emitter metal layer 224 of preferably Ti/Pt/Au in thicknesses of, for example, 300/250/3000 Angstroms, respectively, is deposited and then lifted off, resulting in the structure of FIG. 11b. The emitter contact metal 224 is then used as a natural mask for the subsequent removal of WSi which may be done with CF$_4$/O$_2$ plasma reactive ion etching, resulting in the structure of FIG. 11c. A solution of H$_2$SO$_4$:H$_2$O$_2$:H$_2$O in the ratio 1:8:160 (by volume), for example, is then used to etch to the base layer 216. A silicon nitride insulator layer 226 may then be deposited to form the structure of FIG. 11d. This layer may then be etched using, for example, Reactive Ion Etching, but because of the directionality of this technique, the insulator sidewall 226 remains while all of the exposed insulator is removed, as shown in FIG. 11e. Photoresist (not shown) again may be spun on and patterned to define the location of the base contacts 228 and emitter contact 232; this exposes emitter islands 214 and sidewalls 226 in addition to a portion of the base epilayer 216. Ti/Pt/Au metals may be evaporated in sequence at thicknesses of, for example, 500, 250 and 1500 Angstroms, respectively, onto the photoresist and exposed areas. The overhanging sidewalls 226 shadow the part of the base epilayer 216 adjacent to emitter 214, so the evaporated metal does not contact emitter 214. The photoresist may then be removed which lifts off the metal except the portion 228 which is on the base epilayer 216 and the portion 232 above emitter island 14 and sidewalls 226. The resulting structure is shown in FIG. 11f. Photoresist (not shown) may then be deposited and patterned to define the connection to the subcollector layer 220. Layers 216, and 218 are then etched using a solution of H$_2$SO$_4$:H$_2$O$_2$:H$_2$O in the ratio of 1:8:160 (by volume), for example. Afterwards, AuGe/Ni/Au metals may be evaporated onto the wafer to thicknesses of, for example, 500/140/2000 Angstroms, respectively, to form the collector contact 230. The photoresist layer may then be stripped, which lifts off all excess metallization, and results in the structure shown in FIG. 11g. The remaining metal may then be alloyed at 430° C. for 1 minute, for example, to provide ohmic contact.

Several embodiments have been described in detail hereinabove. It is to be understood that the scope of the invention also comprehends embodiments different from those described, yet within the scope of the claims. For example, other materials and methods than those suggested could be utilized. Internal and external connections can be ohmic, capacitive, direct or indirect, via intervening circuits or otherwise. Implementation is contemplated in discrete components or fully integrated circuits in silicon, gallium arsenide, indium phosphide, or other electronic material families, as well as in optical based or other technology based forms and embodiments. Words of inclusion are to be interpreted as nonexhaustive in considering the scope of the invention.

Figure 12:
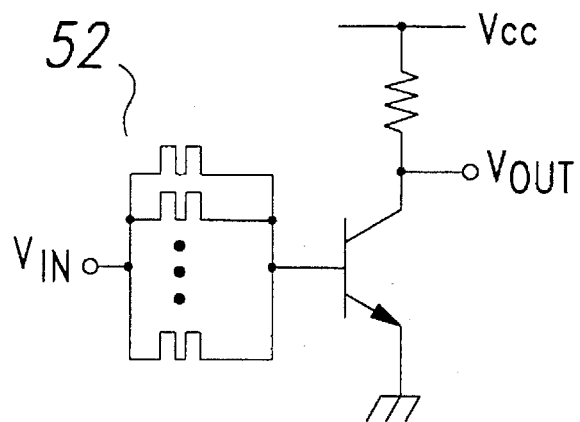
FIG. 12 is a circuit schematic of a resonant tunneling transistor with multiple base fingers.

While this invention has been described with reference to illustrative embodiments, this description is not intended to be construed in a limiting sense. For example, an analogically identical configuration to FIGS. 7a–10b may be obtained by formation of multiple base fingers 52, as shown schematically in FIG. 12. The dc and ac transfer characteristic of the multiple base finger device will exhibit a comparable capability to generate incoherent switching noise and broadband oscillation. The variations available for a multi-emitter configuration, such as those described in reference to FIGS. 7a–10, may also be applied to the multi-base configuration of FIG. 12.

Figure 13:
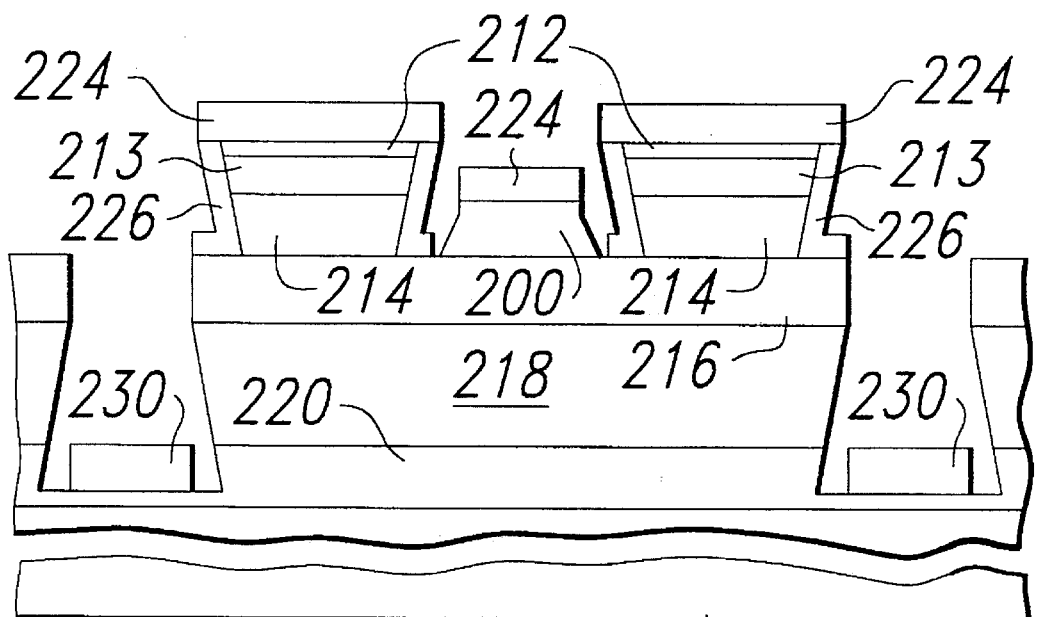
FIG. 13 is a cross-sectional view of an embodiment of a resonant tunneling transistor with multiple base fingers.

Fabrication of the multiple base finger device can be understood from the device cross section of FIG. 13. The numbered layers are the same as in FIGS. 11a–11g with the exception that layer 210 is not used in the starting structure and layer 200 is preferably an n-doped GaAs layer formed by, for example, MOCVD epitaxial regrowth using a masking material such as silicon nitride. The regrowth is performed before deposition of any metals. Those skilled in the art will see that tile remaining steps are an application of the multiple emitter resonant tunneling transistor such as those described with respect to FIGS. 11a–11g. The method of fabrication is provided only as an example and it is contemplated that other methods may be used to achieve the present invention.

Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for generating a signal with at least two noise spikes thereon comprising:

forming a multi-emitter transistor having at least two emitter fingers, a base and a collector;

forming a resonant tunneling diode in each said emitter finger, each said resonant tunneling diode having a unique switching voltage different from the switching voltage of each other said resonant tunneling diode; and applying a time varying signal to said base to produce a time varying signal at said collector having noise spikes thereon caused by switching of said resonant tunneling diodes.

2. The method of claim 1, wherein the area of two or more of said emitter fingers is unequal.

3. The method of claim 1, wherein a resistor is placed in series with one or more of said resonant tunneling diodes.

4. A resonant tunneling transistor comprising:

a collector;

a plurality of emitter fingers with at least one resonant tunneling diode in series with each of said emitter fingers, each said resonant tunnel in a diode having a unique switching voltage different from the switching voltage of any other said resonant tunneling diode; and a base.

5. The transistor of claim 4, wherein a resistor is placed in series with one or more of said resonant tunneling diodes such that each of said resonant tunneling diode switches at a different input voltage, thereby increasing the effective width of said transistor's negative differential resistance region such that switching noise spikes are introduced into the transfer characteristic said transistor.

6. The transistor of claim 4, wherein said transistor comprises III–V materials.

7. A method for generating a signal with at least two noise spikes thereon comprising:

forming a multi-base transistor having at least two bases, a collector and an emitter;

forming a resonant tunneling diode in series with each said base, each said resonant tunneling diode having a unique switching voltage different from the switching voltage of any other said resonant tunneling diode;

applying a time varying signal to each said base through the resonant tunneling diode coupled thereto to produce a time varying signal at said collector having noise spikes thereon caused by switching of said resonant tunneling diodes.

8. The method of claim 7, wherein the area of two or more of said base fingers is unequal.

9. The method of claim 7, wherein a resistor is placed in series with one or more of said resonant tunneling diodes.

10. A resonant tunneling transistor comprising:

a collector;

an emitter;

at least two bases; and a resonant tunneling diode formed in series with each said base, each said resonant tunneling diode having a unique switching voltage different from the switching voltage of any other said resonant tunneling diode.

11. The transistor of claim 10, wherein the area of said base varies such that each of said resonant tunneling diode switches at a different input voltage. thereby increasing the effective width of said transistor's negative resistance region such that a switching noise spike is introduced into the transfer characteristic of said transistor.

12. The transistor of claim 10, wherein a resistor is placed in series with one or more of said resonant tunneling diodes such that each of said resonant tunneling diode switches at a different input voltage, thereby increasing the effective width of said transistor's negative differential resistance region such that a switching noise spike is introduced into the transfer characteristic of said transistor.

13. The transistor of claim 10, wherein said transistor comprises III–V materials.

* * * * *